United States Patent

Cadotte, Jr. et al.

[11] Patent Number: 5,309,117
[45] Date of Patent: May 3, 1994

[54] SUPERCONDUCTING RING RESONATOR MICROWAVE OSCILLATOR FOR OPERATING AS A REMOTE TEMPERATURE SENSOR

[75] Inventors: Roland Cadotte, Jr., Freehold; Michael Cummings, Howell, both of N.J.; Adam Rachlin, Germantown, Md.; Richard W. Babbitt, Fair Haven, N.J.

[73] Assignee: The United States of America as represented by the Secretary of the Army, Washington, D.C.

[21] Appl. No.: 5,692

[22] Filed: Jan. 19, 1993

[51] Int. Cl.$^5$ .................... H03B 5/18; G01K 7/00
[52] U.S. Cl. .................... 331/66; 331/96; 331/107 S; 331/107 SL; 331/117 D
[58] Field of Search ............ 331/66, 96, 99, 107 SL, 331/107 S, 107 DD, 117 D

[56] References Cited

U.S. PATENT DOCUMENTS

| | | | |
|---|---|---|---|
| 4,185,252 | 1/1980 | Gerlach | 331/99 X |
| 5,115,210 | 5/1992 | Cummings et al. | 331/66 X |
| 5,204,641 | 4/1993 | Fiedziuszko et al. | 331/107 S X |

*Primary Examiner*—David Mis
*Attorney, Agent, or Firm*—Michael Zelenka; William H. Anderson

[57] ABSTRACT

A remote temperature sensor includes a microwave oscillator which generates an output signal having a frequency which is proportional to the temperature of the environment in which it is located. The oscillator includes a relatively high transition temperature superconducting (HTSC) ring coupled to a transistor in a plurality of microstrip line oscillator configurations including those of a reaction oscillator, a transmission oscillator, a reflection oscillator and a parallel feedback oscillator. The superconducting ring operates below its transition temperature and in so doing, acts as a high Q resonator whose resonant frequency is proportional to temperature.

15 Claims, 1 Drawing Sheet

SUPERCONDUCTING RING RESONATOR MICROWAVE OSCILLATOR FOR OPERATING AS A REMOTE TEMPERATURE SENSOR

GOVERNMENT INTEREST

The invention described herein may be manufactured, used and licensed by or for the Government for Governmental purposes without the payment of any royalty thereon or therefor.

BACKGROUND OF THE INVENTION

This invention relates to microwave oscillators and superconductors and more particularly to a temperature sensor in the form of a microwave oscillator including a superconductor element operating below its transition temperature.

Stable microwave and millimeter wave signal sources fabricated via microstrip or planar circuit techniques on substrates are well known and are typically in the form of fixed frequency oscillators. One type of such oscillator comprises what is known as a ring resonator oscillator which exhibits not only relatively good frequency stability, but is simple in its circuit configuration. Moreover, transistor ring resonator oscillators integrate readily into miniature and microminiature integrated circuit technology where gallium arsenide (GaAs) field effect transistors (FET) are typically used. The details of a microstrip ring resonator oscillator are generally shown and disclosed, for example, in U.S. Pat. No. 4,185,252, entitled, "Microstrip Open Ring Resonator Oscillator", and issued to Horst W. A. Gerlach on Jan. 22, 1980. A remote temperature sensor including a ring resonator is also shown and described in U.S. Pat. No. 5,115,210, entitled "Microwave oscillator For Operating As A Remote Temperature Sensor", issued in the names of Adam Rachlin et al on May 19, 1992. The teachings of both of these patents are meant to be incorporated herein by reference.

SUMMARY OF THE INVENTION

It becomes an object of the present invention, therefore, to provide an improvement in ring resonator oscillators.

It is another further object of the invention to provide a ring resonator oscillator which is adapted to operate as an ambient condition sensor.

And still another object of the invention is to provide a ring resonator oscillator which is adapted to operate as an inexpensive temperature sensor for use in a variety of environments.

And yet a further object of the invention is to provide an unmanned, remote, highly accurate and inexpensive ring resonator type temperature sensor which can be used in extremely cold environments such as deep outer space.

Briefly, the foregoing and other objects of the invention are achieved by a remote temperature sensor comprised of a microwave oscillator which generates an output signal having a frequency which is proportional to the temperature of the environment in which it is located. The oscillator includes a high transition temperature superconducting (HTSC) ring resonator coupled to a transistor in a plurality of microstrip line oscillator configurations including those of a reaction oscillator, a transmission oscillator, a reflection oscillator and a parallel feedback oscillator. The superconducting ring operates below its transition temperature and in so doing, acts as a high Q resonator whose resonant frequency is proportional to temperature.

BRIEF DESCRIPTION OF THE DRAWING

The following detailed description of the invention will be more readily understood when considered together with the accompanying drawing in which.

DETAILED DESCRIPTION OF THE PREFERRED EMBODIMENTS

Figure 1:
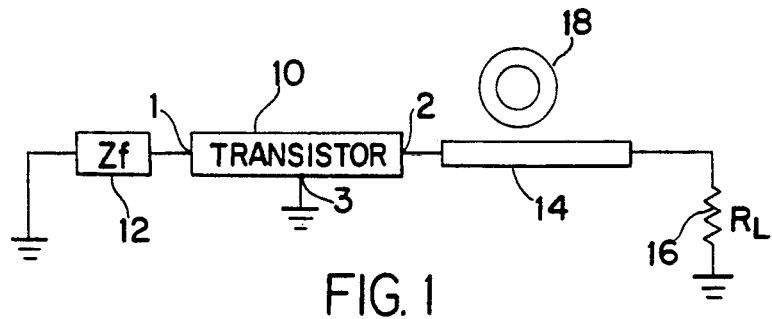
FIG. 1 is an electrical schematic diagram of a first preferred embodiment of the invention and one of a reaction oscillator.
Figure 2:
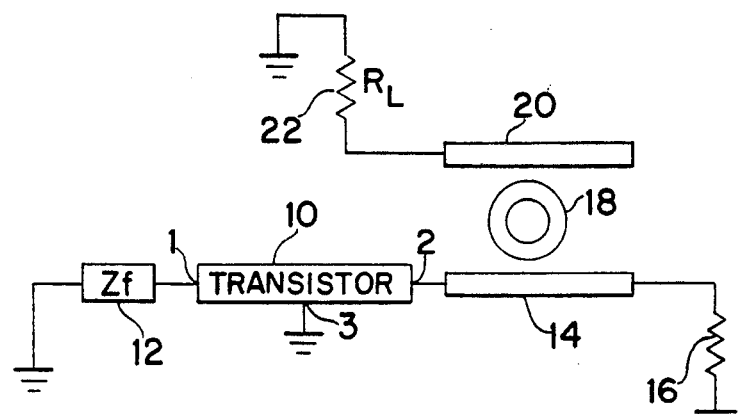
FIG. 2 is an electrical schematic diagram of a second preferred embodiment of the invention and one of a transmission oscillator.

Referring now to the drawings wherein like reference numerals refer to like elements, reference will be made first to FIG. 1 wherein there is shown a schematic diagram illustrative of a first embodiment of the invention which is in the form of a transistor reaction oscillator. As shown, a transistor 10 includes three signal ports including a control electrode and a pair of current conducting electrodes, with signal port 1 (control electrode) comprising, for example, the gate of a field effect transistor or the base of a bipolar junction transistor, port 2 (current conducting electrode) comprises a drain or collector and port 3 (current conducting electrode) comprises a source or emitter terminal of such transistors. A low Q series feedback impedance 12 of a value $Z_f$ is coupled from port 1 to ground. Port 2 is coupled to ground through the series combination of a predetermined length of planar microstrip transmission line 14 and a resistor 16 which in this embodiment acts as the load $R_L$. Port 3 is shown coupled directly to ground. Positioned adjacent to the microstrip transmission line element 14 is a high Q superconducting HTSC ring resonator 18 comprised of a superconductor material in the form of a thin film fabricated on a substrate, for example, not shown, and having a relatively high transition temperature, e.g. in the range of 110K. Below the superconductor's transition temperature, the ring 18 acts as a high Q resonator whose resonant frequency is proportional to temperature.

In the reaction oscillator configuration as shown in FIG. 1, a negative resistance is generated at port 2 by the low Q series feedback impedance $Z_f$ as shown by reference numeral 12. The ring resonator 18 present at port 2 transforms the impedance directed into port 2 which may be, a parallel negative resistive, inductive, capacitive (RLC) circuit into a negative resistance, with no reactive component, the magnitude of which is greater than the load's passive resistance. This transformation is dependent on the resonator coupling the distance between the resonator 18 and the transistor 10 and finally on the operating point of the resonator on its resonance curve.

In the second embodiment, a transmission oscillator configuration is implemented by a second length of microstrip transmission line 20 located adjacent the resonator 18 opposite from the transmission line element 14 coupled to port 2 of transistor 10. The second transmission line element 20 is further shown coupled to ground through a resistor 22 which in this embodiment acts as the load $R_L$. In this configuration, the resonator 18 also acts like a series RLC circuit. A negative resistance is generated in the same way as noted with respect to the reaction oscillator shown in FIG. 1; however, the HTSC resonator 18 also serves to filter the output signal which is taken across the load resistor 22.

Figure 3:
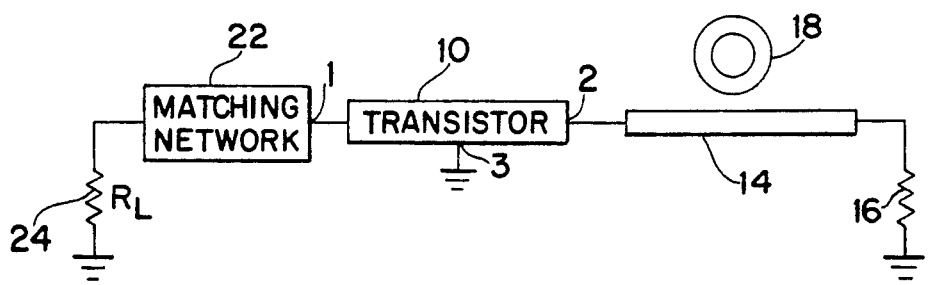
FIG. 3 is an electrical schematic diagram of a third preferred embodiment of the invention and one of a reflection oscillator.

Referring now to FIG. 3, shown thereat is a reflection oscillator circuit. The feedback impedance $Z_f$ of FIG. 1 is replaced by a distributed matching network 22 coupled to ground through a resistor 24 which functions as the load $R_L$ in this embodiment. The negative resistance is generated by the impedance presented to the transistor 10 at port 2 by the HTSC ring resonator 18. The matching network 22 transforms the load 24 into the required complex impedance required for oscillations. In the reflection oscillator configuration of FIG. 3, the resonator ring 18 also acts like a parallel RLC circuit.

Figure 4:
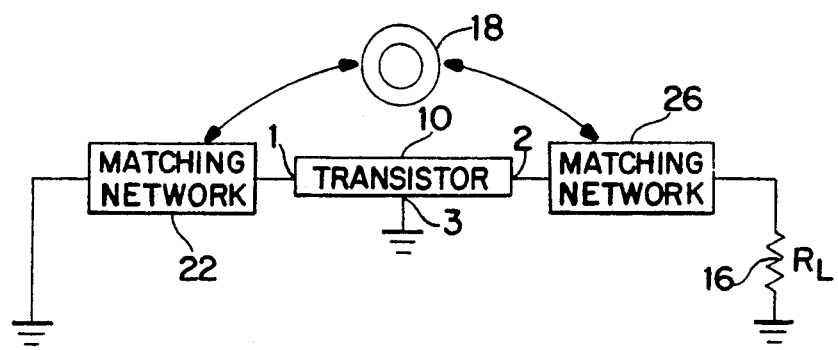
FIG. 4 is an electrical schematic diagram of a fourth preferred embodiment of the invention and one of a parallel feedback oscillator.

Turning attention now to FIG. 4, shown thereat is a parallel feedback oscillator including both the transistor 10 and the HTSC ring resonator 18; however, the resonator 18 is capacitively coupled to both ports 1 and 2 of the transistor 10. The ring resonator is the feedback mechanism which induces the transistor to oscillate. The matching network 22 coupled to port 1 is coupled directly to ground, while the matching network 26 coupled to port 2 is coupled to ground through the load $R_L$ comprising the resistor 16. In the parallel feedback oscillator, the HTSC ring resonator 18 acts as a series RLC circuit.

In all four embodiments, the HTSC resonator 18 undergoes a relatively large reactive change vs. frequency as its resonance locks the frequency of the oscillator. Since the Q of the superconducting ring resonator 18 is extremely high, the oscillators are very stable at a specific temperature. As the temperature changes, however, the resonant frequency of the ring 18 changes due to the change in the superconductor's kinetic conductance, thereby causing the oscillator frequency to shift accordingly. Experimental results have indicated a 50 MHz change in the temperature range between 49K and 71K for a predetermined HTSC thin film ring, with the Q remaining substantially constant. With the ring incorporated in any oscillator configuration, the oscillation frequency will coincide with the ring's resonant frequency and therefore will shift with temperature, thereby providing a relatively simple temperature sensor which will permit unmanned, remote, highly accurate and inexpensive temperature sensing in extremely cold environments, such as deep space. In order to assure consistent performance, all other components of the sensor oscillators configured in accordance with the subject invention, must be substantially independent of temperature.

Although these temperature sensors will not operate above the superconductor ring's transition temperature, they offer greater accuracy and improved temperature resolution than similar sensors that use non-superconducting metal rings, since the Qs of superconducting rings are over an order of magnitude greater than non-superconductive metallic rings.

Having thus shown and described what is at present considered to be the preferred embodiments of the invention, it should be noted that the same has been made by way of illustration and not limitation. Accordingly, all modifications, alterations and changes coming within the spirit and scope of the invention are herein meant to be included.

What is claimed is:

1. A ring oscillator circuit for operating as a temperature sensor, comprising:
    a transistor including a control electrode and a pair of current conducting electrodes; and
    circuit means coupled to said control electrode and said current conducting electrodes for implementing an oscillator circuit;
    said circuit means including a superconducting ring resonator having a predetermined transition temperature and operating below the transition temperature and further having a resonance characteristic which is temperature sensitive and which shifts the output frequency of said oscillator circuit with changes in temperature for temperature sensing.

2. The ring oscillator circuit as defined by claim 1 wherein said transistor circuit comprises a microwave oscillator circuit.

3. The ring oscillator circuit as defined by claim 1 wherein said transistor comprises a junction transistor.

4. The ring oscillator circuit as defined by claim 1 wherein said transistor comprises a field effect transistor.

5. The ring oscillator circuit as defined by claim 1 wherein said superconducting ring resonator comprises a high temperature superconducting (HTSC) ring resonator.

6. The ring oscillator circuit as defined by claim 5 wherein HTSC ring resonator comprises an annular ring.

7. The ring oscillator circuit as defined by claim 5 wherein the transition temperature is equal to than 110K.

8. The ring oscillator circuit as defined by claim 1 wherein said circuit means further includes a length of planar transmission line having one end coupled to one of said current conducting electrodes and wherein said superconducting ring resonator is located adjacent said planar transmission line.

9. The ring oscillator circuit as defined by claim 8 wherein said circuit means includes a first impedance element coupled to the other end of said transmission line and a second impedance element coupled to the other of said current conducting electrodes.

10. The ring oscillator circuit as defined by claim 9 wherein said first impedance element comprises a load impedance and said second impedance element comprises a feedback impedance.

11. The ring oscillator circuit as defined by claim 9 wherein said circuit means includes another length of planar transmission line located adjacent said superconducting ring resonator and having one end coupled to a third impedance element.

12. The ring oscillator circuit as defined by claim 11 wherein said first impedance element comprises a first resistive impedance element, said second impedance element comprises a feedback impedance, and said third impedance element comprises a second resistive impedance element which acts as a load resistance.

13. The ring oscillator circuit as defined by claim 8 wherein said circuit means includes a first impedance element coupled to the other end of said transmission line, an impedance matching network having one end coupled to the other of said pair of current conducting electrodes, and a second impedance element coupled to the other end of said impedance matching network.

14. The ring oscillator circuit as defined by claim 13 wherein said second impedance element comprises a load impedance.

15. The ring oscillator circuit as defined by claim 1 wherein said circuit means further includes first and second impedance matching networks respectively coupled to said pair of current conducting electrodes, a load impedance coupled to one said impedance matching networks and wherein said superconducting ring resonator is coupled between said impedance matching networks.

* * * * *